United States Patent
Yasunobe

(10) Patent No.: US 11,698,584 B2
(45) Date of Patent: Jul. 11, 2023

(54) CONVEYANCE APPARATUS, LITHOGRAPHY APPARATUS, AND ARTICLE MANUFACTURING METHOD

(71) Applicant: CANON KABUSHIKI KAISHA, Tokyo (JP)

(72) Inventor: Osamu Yasunobe, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 338 days.

(21) Appl. No.: 17/099,711

(22) Filed: Nov. 16, 2020

(65) Prior Publication Data
US 2021/0165319 A1 Jun. 3, 2021

(30) Foreign Application Priority Data

Dec. 3, 2019 (JP) .................................. 2019-219077

(51) Int. Cl.
| | |
|---|---|
| *G03F 7/20* | (2006.01) |
| *G03F 7/00* | (2006.01) |
| *H01L 21/683* | (2006.01) |
| *H01L 21/687* | (2006.01) |

(52) U.S. Cl.
CPC ........ *G03F 7/0002* (2013.01); *G03F 7/70733* (2013.01); *H01L 21/6838* (2013.01); *H01L 21/68707* (2013.01)

(58) Field of Classification Search
CPC ............... G03F 7/0002; G03F 7/70733; H01L 21/6838; H01L 21/68707; H01L 21/67742; H01L 21/027; H01L 21/67225; B25J 15/0014; B25J 15/0616; G01N 15/10

See application file for complete search history.

(56) References Cited

U.S. PATENT DOCUMENTS

2012/0235335 A1* 9/2012 Hayashi .............. H01L 21/6838
269/21

FOREIGN PATENT DOCUMENTS

| JP | 2016039250 A | * | 3/2016 |
|---|---|---|---|
| JP | 2016039250 A | | 3/2016 |

* cited by examiner

*Primary Examiner* — Mesfin T Asfaw
(74) *Attorney, Agent, or Firm* — Rossi, Kimms & McDowell LLP

(57) ABSTRACT

The present invention provides a conveyance apparatus that conveys an object to a processing space in which processing is performed using the object, including a hand configured to hold the object, and a moving unit configured to freely move the hand in the processing space, wherein the hand includes a suction hole provided in a surface different from a holding surface configured to come into contact with the object and hold the object, and a first flow path configured to allow the suction hole and an exhaust source to communicate with each other, and exhaust an atmosphere around the suction hole sucked via the exhaust source and the suction hole to an outside.

15 Claims, 6 Drawing Sheets

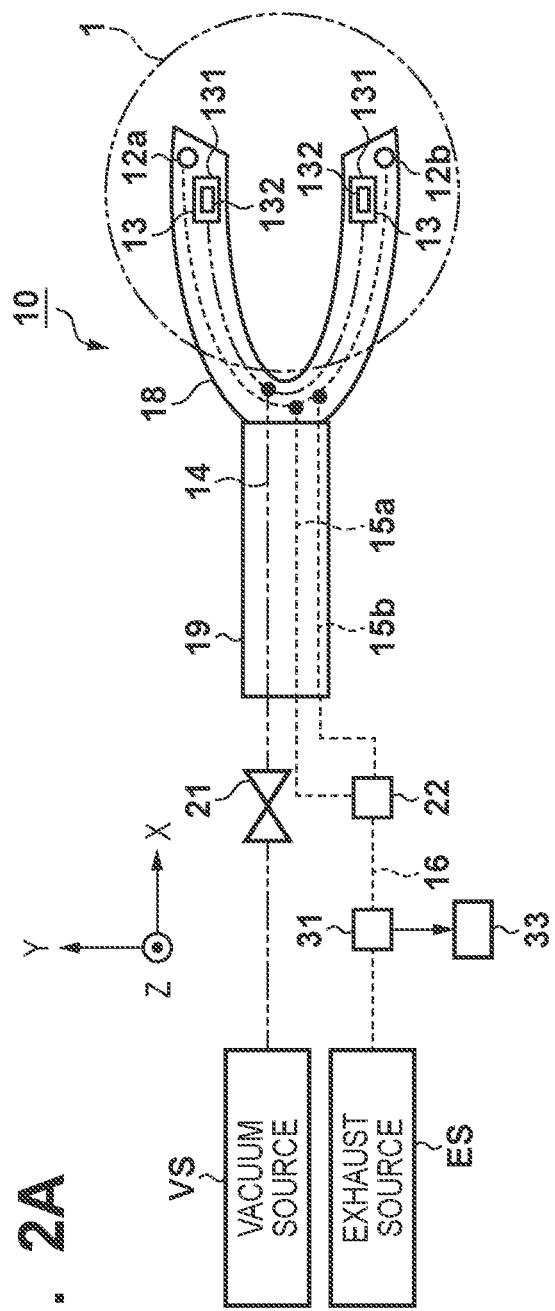
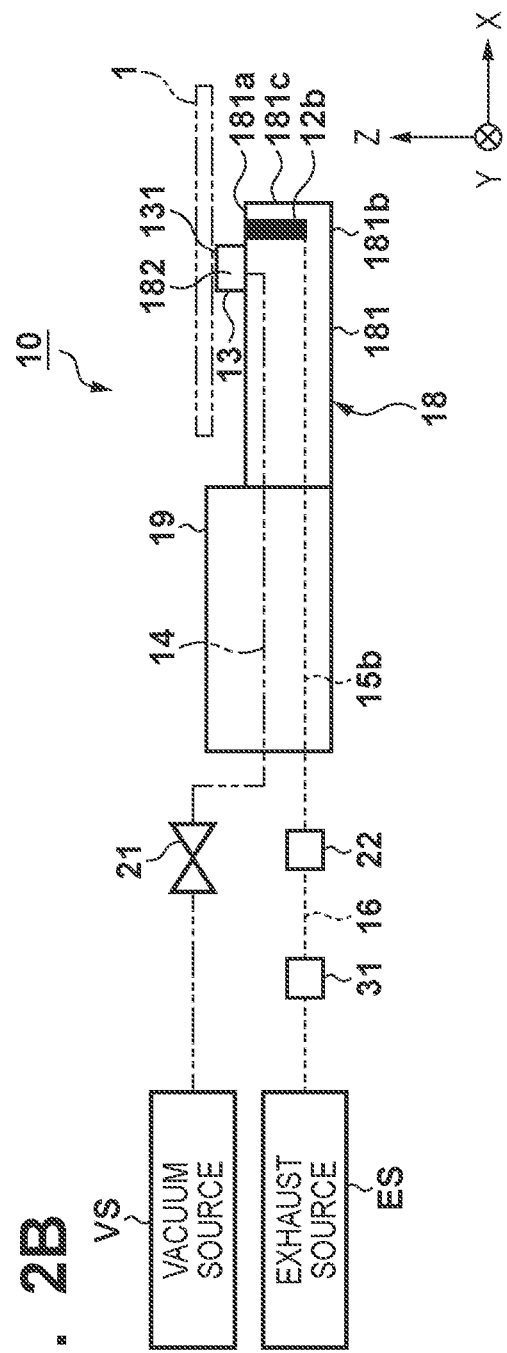
FIG. 2A
FIG. 2B

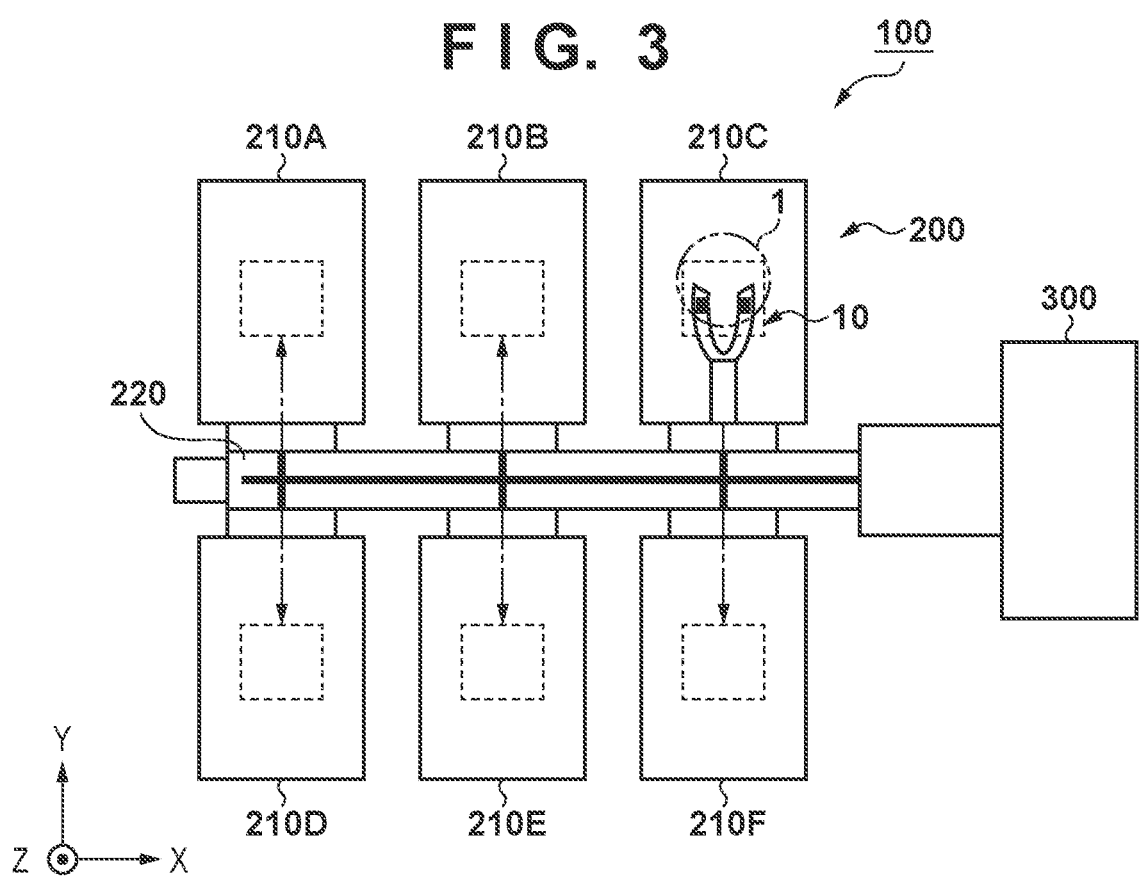
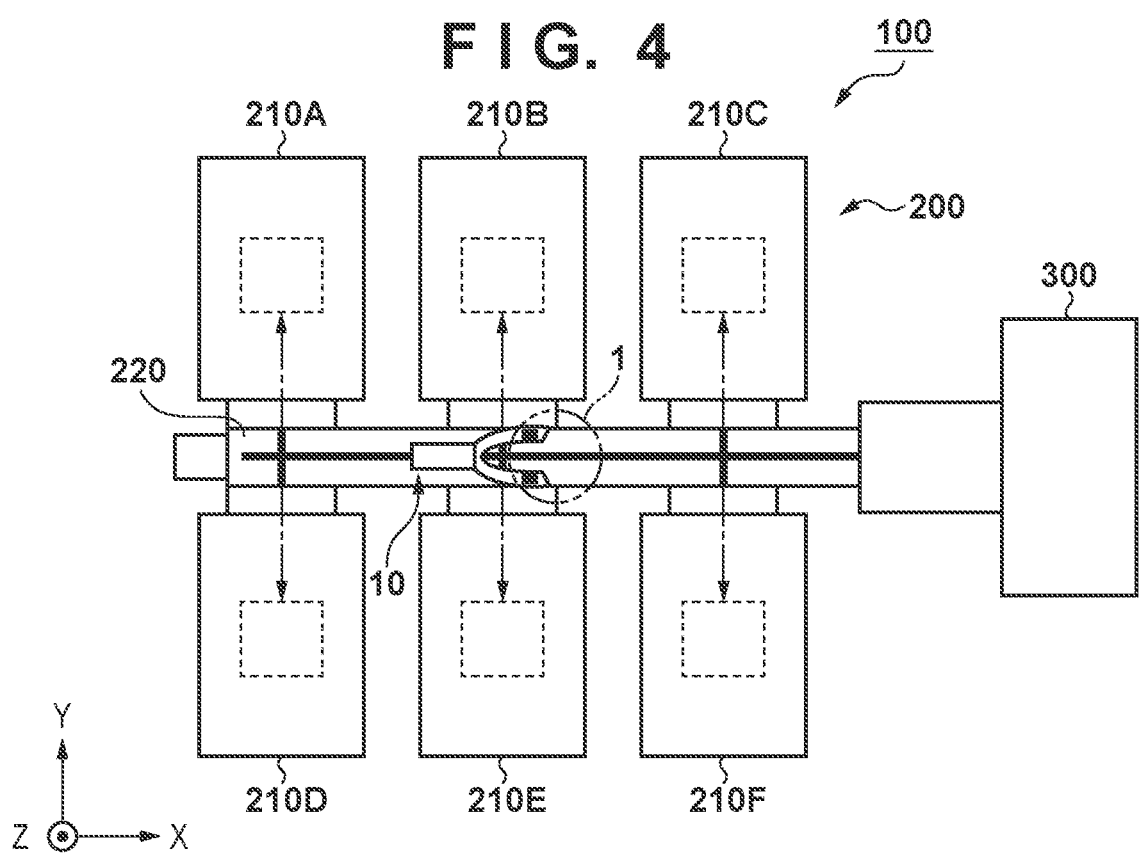

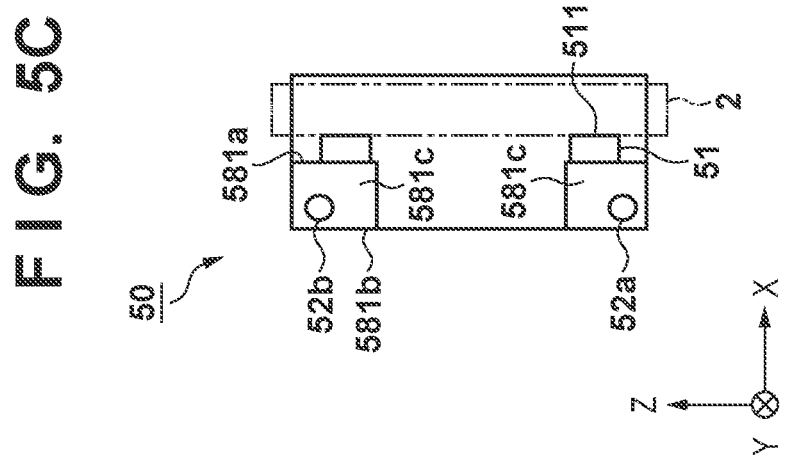
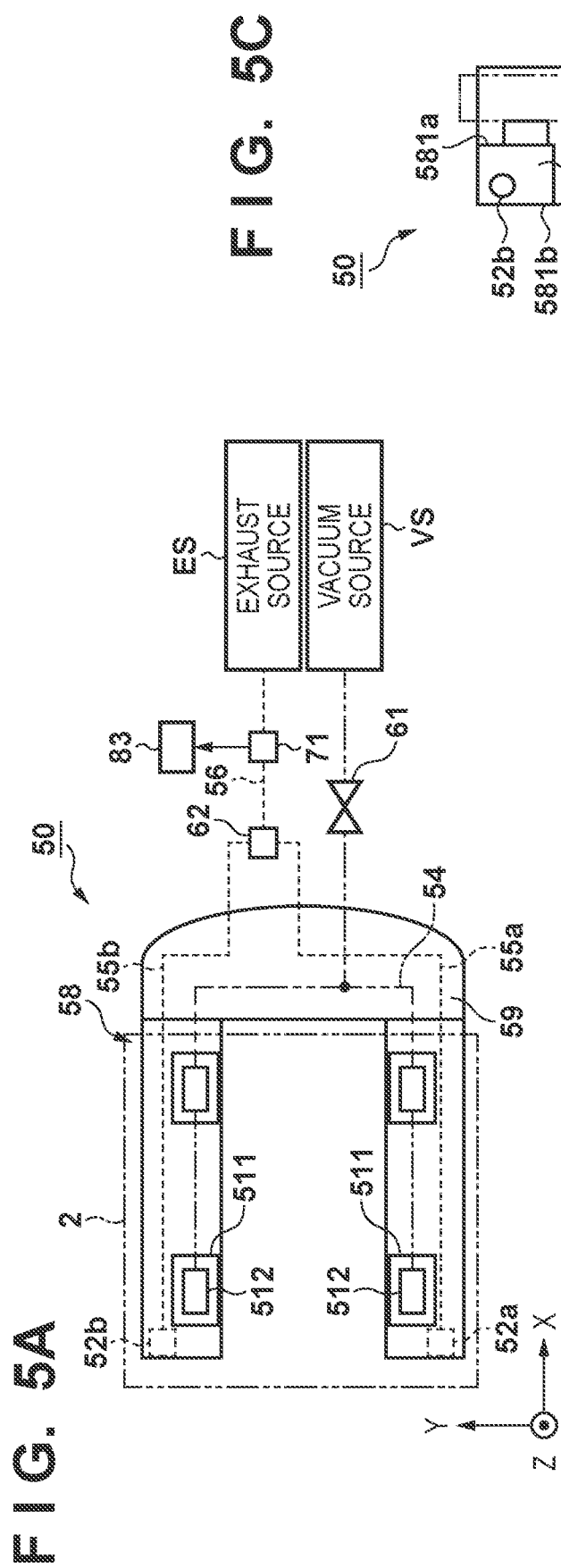
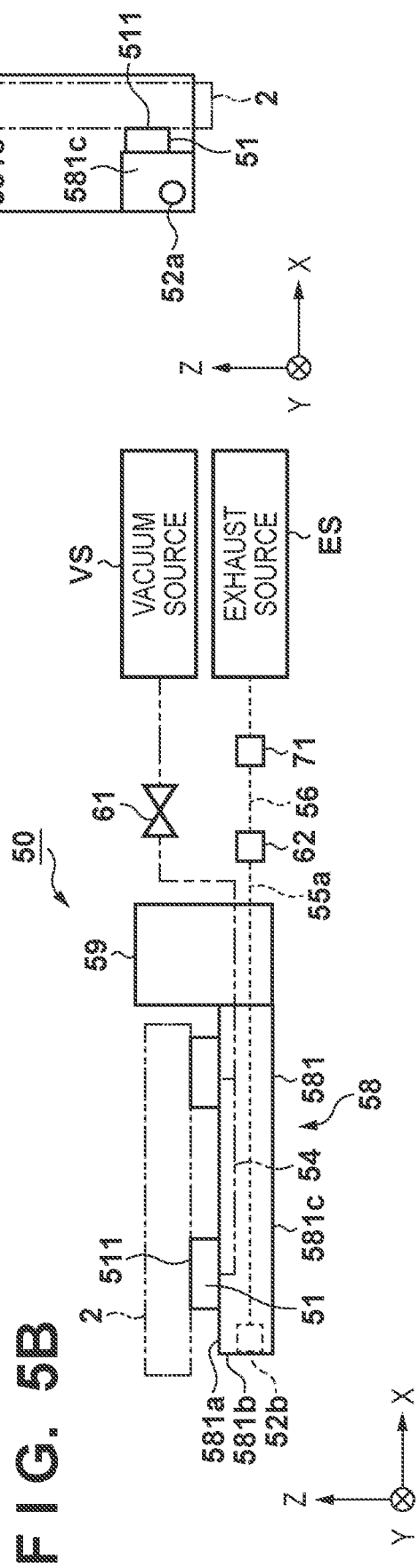

CONVEYANCE APPARATUS, LITHOGRAPHY APPARATUS, AND ARTICLE MANUFACTURING METHOD

BACKGROUND OF THE INVENTION

Field of the Invention

The present invention relates to a conveyance apparatus, a lithography apparatus, and an article manufacturing method.

Description of the Related Art

As demands for miniaturization of semiconductor devices, MEMS, and the like rise, a microprocessing technique of forming a pattern of an imprint material on a substrate by curing the imprint material while the imprint material on the substrate is in contact with a mold, a so-called imprint technique has attracted attention. According to an imprint apparatus that adopts the imprint technique, a microstructure on the order of several nanometers can be formed on a substrate. In addition, the imprint apparatus is used not only in manufacturing a semiconductor device and the like but also in manufacturing a replica (copy) mold from a master mold.

In the imprint apparatus, if particles are sandwiched between a substrate (an object onto which a pattern is transferred) and a mold (an object whose pattern is transferred), a defective pattern (manufacturing defect) is formed on the substrate, or the substrate or the mold is damaged. Therefore, in the imprint apparatus, it is important to suppress generation of particles and to convey and process the substrate and the mold in a space in which no particle is floating (exists). This is not limited to the imprint apparatus, and also in lithography apparatuses in general, for example, an exposure apparatus, it is unpreferable that particles adhere to a substrate or an original. Further, in a semiconductor device manufacturing process, along with the miniaturization of the pattern due to high integration of integrated circuits, more strict management is required for particles, particularly, dust and chemical contamination.

Therefore, in relation to particle management, a technique of collecting particles has been proposed in Japanese Patent Laid-Open No. 2016-39250. Japanese Patent Laid-Open No. 2016-39250 discloses a cleaning jig capable of collecting particles, which is related to a substrate conveyance mechanism including a holding member (hand) that holds a substrate and moves in a plurality of processing spaces. The cleaning jig is formed by a plate-like body in which a plurality of suction holes and connection ports for connecting the plurality of suction holes to a suction pump are formed. In Japanese Patent Laid-Open No. 2016-39250, the atmosphere (gas) in the vicinity of the suction holes is sucked (exhausted) via the suction holes and the connection ports while the cleaning jig is held by the holding member, thereby actively collecting particles existing in the vicinity of the suction holes.

However, the technique disclosed in Japanese Patent Laid-Open No. 2016-39250 requires the cleaning jig when collecting particles, so that the device cost increases, and the management and processing become complicated. Further, in the technique disclosed in Japanese Patent Laid-Open No. 2016-39250, in order to collect particles, the holding member must hold the cleaning jig instead of the substrate, so particles cannot be collected during the conveyance of the substrate.

SUMMARY OF THE INVENTION

The present invention provides a conveyance apparatus advantageous in particle management.

According to one aspect of the present invention, there is provided a conveyance apparatus that conveys an object to a processing space in which processing is performed using the object, including a hand configured to hold the object, and a moving unit configured to freely move the hand in the processing space, wherein the hand includes a suction hole provided in a surface different from a holding surface configured to come into contact with the object and hold the object, and a first flow path configured to allow the suction hole and an exhaust source to communicate with each other, and exhaust an atmosphere around the suction hole sucked via the exhaust source and the suction hole to an outside.

Further aspects of the present invention will become apparent from the following description of exemplary embodiments with reference to the attached drawings.

BRIEF DESCRIPTION OF THE DRAWINGS

FIGS. 2A and 2B are schematic views showing an example of the arrangement of a conveyance apparatus.

FIG. 3 is a view showing an example of a state in which the number of particles is counted.

FIG. 4 is a view showing another example of the state in which the number of particles is being counted.

FIGS. 5A to 5C are schematic views showing an example of the arrangement of a conveyance apparatus.

DESCRIPTION OF THE EMBODIMENTS

Figure 1:
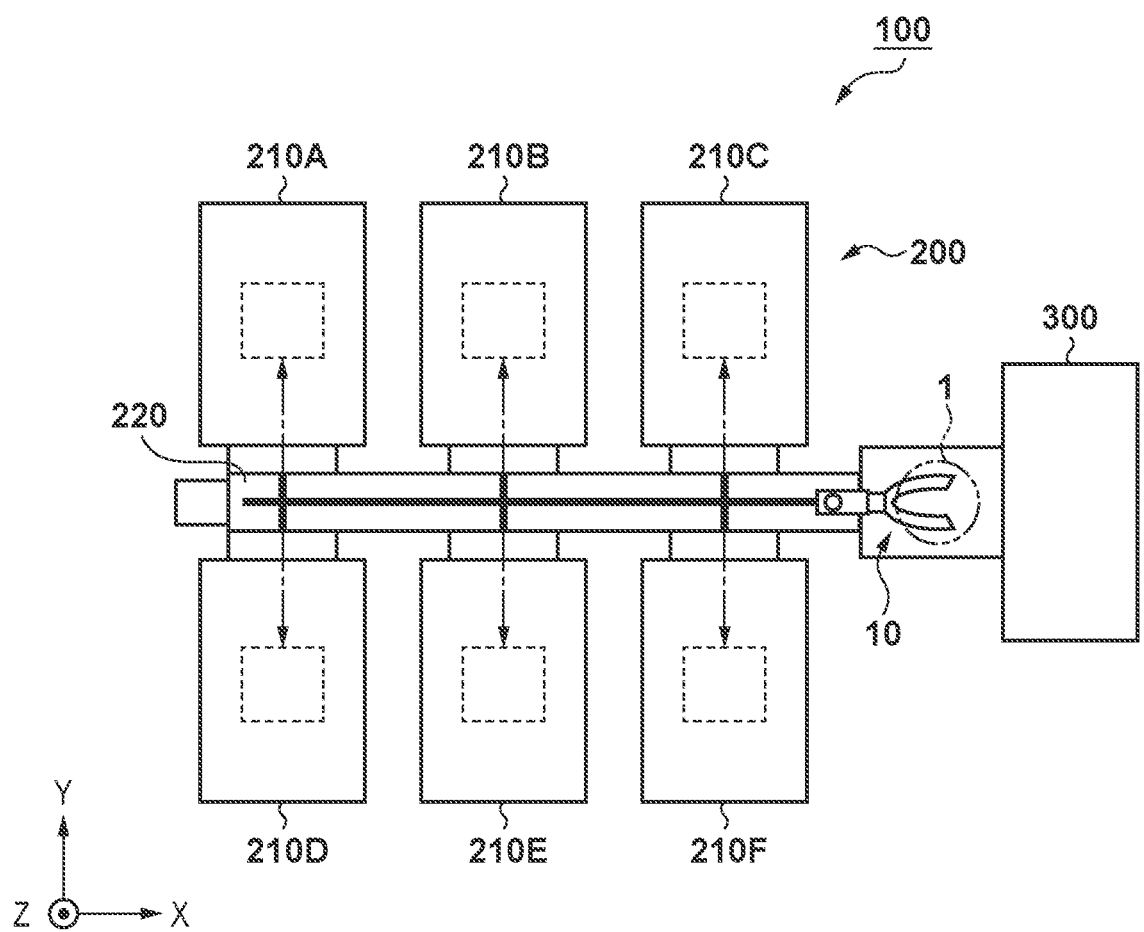
FIG. 1 is a schematic view showing the configuration of a lithography system.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view showing the configuration of a lithography system 100. The lithography system 100 is a processing system including a conveyance apparatus 10, a lithography apparatus 200, and a preprocessing apparatus 300. Note that in the following description, as shown in FIG. 1, directions will be indicated on an XYZ coordinate system in which directions parallel to the surface of a substrate 1 are defined as the X-Y plane. Directions parallel to the X-axis, the Y-axis, and the Z-axis of the XYZ coordinate system are the X direction, the Y direction, and the Z direction, respectively.

The lithography apparatus 200 is a processing apparatus that forms a pattern on the substrate 1, and in this embodiment, a so-called cluster type processing apparatus including a plurality of processing units 210 (processing spaces) for performing processing of forming a pattern on the substrate 1. However, the lithography apparatus 200 is not limited to the cluster type processing apparatus, and it may be a processing apparatus including a single processing unit. More specifically, the lithography apparatus 200 includes six processing units 210A, 210B, 210C, 210D, 210E, and 210F. In this embodiment, the lithography apparatus 200 is embodied as an imprint apparatus that forms a pattern of an imprint material on the substrate 1 using a mold serving as an original. However, the lithography apparatus 200 is not limited to the imprint apparatus, and it may be, for example, an exposure apparatus that transfers a pattern of a mask serving as an original onto the substrate 1 via a projection optical system.

The preprocessing apparatus 300 performs, on the substrate 1, preprocessing required to form a pattern on the substrate 1 before forming the pattern on the substrate 1, that is, before loading the substrate 1 to the lithography apparatus 200 via the conveyance apparatus 10. For example, the preprocessing apparatus 300 includes a cleaning apparatus that cleans the substrate 1, a coating apparatus that coats the substrate 1 with an adhesion layer, and the like.

The conveyance apparatus 10 is an apparatus that conveys an object (substrate or original) to the processing space in which processing is performed using the object. In this embodiment, the conveyance apparatus 10 conveys the substrate 1 between the preprocessing apparatus 300 and the lithography apparatus 200 via a substrate conveyance region 220 (conveyance path).

FIGS. 2A and 2B are schematic views showing an example of the arrangement of the conveyance apparatus 10. FIG. 2A is a plan view of the conveyance apparatus 10, and FIG. 2B is a side view of the conveyance apparatus 10. The conveyance apparatus 10 includes a hand 18 that holds the substrate 1 to convey the substrate 1, and a moving unit 19 that freely moves the hand 18. The substrate 1 is placed on the hand 18 almost horizontally with a processing target surface, which is a surface on which a pattern is to be formed, facing upward on the Z-axis. As shown in FIG. 2B, the hand 18 includes a base member 181, and a holding portion 13 that protrudes (extends in the Z-axis direction) from the base member 181 and defines a holding surface 131 for coming into contact with the substrate 1 and holding the substrate 1. The hand 18 vacuum-chucks the substrate 1 on the holding surface 131 defined by the holding portion 13 in this embodiment, but the present invention is not limited to this. For example, a voltage may be applied to the holding portion 13 to generate a Coulomb force in the holding surface 131, and the substrate 1 may be fixed by the Coulomb force. Note that since the holding portion 13 protrudes from the base member 181 as described above, only the holding portion 13 (holding surface 131) comes into contact with the substrate 1. As shown in FIG. 2A, two holding portions 13 are provided in the hand 18 in this embodiment, but the number of the holding portions 13 may be one, or may be three or more. The moving unit 19 freely moves the hand 18 in the substrate conveyance region 220 and each of the processing units 210A to 210F while the hand 18 is holding the substrate 1. Any arrangement known in the art can be applied to the moving unit 19.

As has been described above, since the substrate 1 is vacuum-chucked on the holding surface 131 defined by the holding portion 13 in this embodiment, the holding surface 131 is provided with a chuck hole 132, and the chuck hole 132 communicates with a vacuum source VS via a vacuum flow path 14 (second flow path). An opening/closing valve 21 is provided in the vacuum flow path 14. By opening the opening/closing valve 21 to exhaust the atmosphere (gas) in the vacuum flow path 14 to the outside by the vacuum source VS, the substrate 1 can be vacuum-chucked on the holding surface 131 via the chuck hole 132.

Further, in this embodiment, the hand 18 is provided with suction holes 12a and 12b. The suction holes 12a and 12b communicate with an exhaust source ES via an exhaust flow path 16. More specifically, the suction hole 12a communicates with the exhaust source ES via an exhaust flow path 15a (first flow path), and the suction hole 12b communicates with the exhaust source ES via an exhaust flow path 15b (first flow path). The exhaust flow path 15a is a flow path for exhausting the atmosphere around the suction hole 12a sucked via the exhaust source ES and the suction hole 12a to the outside. The exhaust flow path 15b is a flow path for exhausting the atmosphere around the suction hole 12b sucked via the exhaust source ES and the suction hole 12b to the outside. The exhaust flow paths 15a and 15b and the vacuum flow path 14 are independent of each other (they form systems different from each other). As shown in FIG. 2A, two suction holes 12a and 12b are provided in the hand 18 in this embodiment, but the number of the suction holes may be one, or may be three or more.

In this embodiment, a switch valve 22 is provided in the exhaust flow path 16 (exhaust flow paths 15a and 15b). The switch valve 22 functions as a switch mechanism that selectively switches between the communication of the exhaust source ES with the exhaust flow path 15a and that with the exhaust flow path 15b. Note that the switch valve 22 also has a function of simultaneously allowing both the exhaust flow paths 15a and 15b to communicate with the exhaust source ES, and a function of blocking the communication of the exhaust source ES with both the exhaust flow paths 15a and 15b. The switch valve 22 can be replaced with a simple opening/closing valve.

Further, in this embodiment, a counting unit 31 that counts the number of particles contained in the atmosphere to be exhausted to the outside via the exhaust flow path 16 (exhaust flow paths 15a and 15b) is provided between the switch valve 22 and the exhaust source ES. The counting unit 31 may not include an exhaust source. In addition, the counting unit 31 need not be provided in the lithography apparatus 200, but may be shared by a plurality of apparatuses. In this case, the counting unit 31 may be provided in the exhaust flow path 16 as needed to count particles. The counting result of the particles obtained by the counting unit 31 is input to a generation unit 33 that has a function of generating a density distribution of particles and a function of specifying a place where particles are generated or flow in.

As shown in FIG. 2B, the suction holes 12a and 12b are provided in a surface different from the holding surface 131. With this arrangement, it becomes possible to exhaust the atmosphere around the suction holes 12a and 12b sucked via the exhaust source ES and the suction holes 12a and 12b to the outside via the exhaust flow path 16 (exhaust flow paths 15a and 15b) while the hand 18 is holding the substrate 1 on the holding surface 131. Note that in this embodiment, the suction holes 12a and 12b are provided in a front surface 181a (first surface) of the base member 181 on the substrate 1 side on which the holding portion 13 is provided (that is, they are open to the substrate 1 side along the Z-axis direction). However, in this case, when particles are counted while the hand 18 is holding the substrate 1 on the holding surface 131, the counting result of the particles may be influenced by the substrate 1. If such influence may occur, the suction holes 12a and 12b may be provided in a back surface 181b (second surface) opposite to the front surface 181a of the base member 181 (that is, they may be open to the opposite side of the substrate 1 along the Z-axis direction). Alternatively, the suction holes 12a and 12b may be provided in a side surface 181c (third surface) orthogonal to the front surface 181a and the back surface 181b of the base member 181 (that is, they may be open along the X-axis direction). In other words, the suction holes 12a and 12b need only be provided in at least one of the front surface 181a, the back surface 181b, and the side surface 181c of the base member 181.

Here, the particle management in the lithography system 100 will be described. As an index of air cleanness, it is customary to numerically indicate how many particles (dust) each having a particle size equal to or larger than 0.5 μm are present in the air per cubic foot (US Federal Air Cleanliness Standard 209E (abolished in November 2001)). Accordingly, as for an index for counting the number of particles by the counting unit 31, it is necessary to collect the atmosphere of one cubic foot per minute. When the exhaust pressure of the exhaust source ES is −101.3 kPa (vacuum) with respect to the atmospheric pressure, in order to secure the above-described flow rate while considering the pressure loss, the opening cross-sectional area of each of the suction holes 12a and 12b is preferably equal to or larger than 4.8 $mm^2$. Similarly, the opening cross-sectional area of each of the exhaust flow paths 15a and 15b is preferably equal to or larger than 4.8 $mm^2$.

FIG. 3 is a view showing a state in which the conveyance apparatus 10 is counting, in the processing unit 210C of the lithography apparatus 200, the number of particles contained in the atmosphere in the processing unit 210C. First, in a state in which the switch valve 22 allows both the exhaust flow paths 15a and 15b to communicate with the exhaust source ES, the counting unit 31 counts the number of particles in the entire atmosphere in the processing unit 210C. Here, if a particle equal to or larger than a standard set in advance, for example, a particle having a particle size equal to or larger than 0.5 μm is counted (detected), the switch valve 22 sets a state in which either one of the exhaust flow paths 15a and 15b communicates with the exhaust source ES. The reason for allowing either one of the exhaust flow paths 15a and 15b to communicate with the exhaust source ES is to specify one of the suction holes 12a and 12b (the position thereof) from which particles are counted. Then, the moving unit 19 moves the hand 18 to each of a plurality of positions in the processing unit 210C. Note that the plurality of positions are set in advance so as to cover (include) the entire processing unit 210C. At this time, the counting unit 31 counts, at each of the plurality of positions in the processing unit 210C, the number of particles contained in the atmosphere around the suction hole 12a or 12b to be exhausted to the outside via the exhaust flow path 15a or 15b, respectively. The counting result of the particles at each of the plurality of positions in the processing unit 210C (the number of particles at each of the plurality of positions in the processing unit 210C counted by the counting unit 31) is input from the counting unit 31 to the generation unit 33. The generation unit 33 generates the density distribution of particles in the processing unit 210C based on the counting result of the particles at each of the plurality of positions in the processing unit 210C, and specifies, from the density distribution, a place where particles are generated or flow in.

Note that the generation unit 33 may provide the user with the density distribution of particles in the processing unit 210C via, for example, a display apparatus such as a display. In this case, based on the density distribution of particles provided by the generation unit 33, the user may specify a place where particles are generated or flow in. The processing as described above is not limited to the processing unit 210C, and can be performed similarly in the other processing units 210A, 210B, 210D, 210E, and 210F.

FIG. 4 is a view showing a state in which the conveyance apparatus 10 is counting, in the substrate conveyance region 220, the number of particles contained in the atmosphere in the substrate conveyance region 220. First, in a state in which the switch valve 22 allows both the exhaust flow paths 15a and 15b to communicate with the exhaust source ES, the counting unit 31 counts the number of particles in the entire atmosphere in the substrate conveyance region 220. Here, if a particle equal to or larger than a standard set in advance, for example, a particle having a particle size equal to or larger than 0.5 μm is counted (detected), the switch valve 22 sets a state in which either one of the exhaust flow paths 15a and 15b communicates with the exhaust source ES. Then, the moving unit 19 moves the hand 18 to each of a plurality of positions in the substrate conveyance region 220. Note that the plurality of positions are set in advance so as to cover (include) the entire substrate conveyance region 220. At this time, the counting unit 31 counts, at each of the plurality of positions in the substrate conveyance region 220, the number of particles contained in the atmosphere around the suction hole 12a or 12b to be exhausted to the outside via the exhaust flow path 15a or 15b, respectively. The counting result of the particles at each of the plurality of positions in the substrate conveyance region 220 (the number of particles at each of the plurality of positions in the substrate conveyance region 220 counted by the counting unit 31) is input from the counting unit 31 to the generation unit 33. The generation unit 33 generates the density distribution of particles in the substrate conveyance region 220 based on the counting result of the particles at each of the plurality of positions in the substrate conveyance region 220, and specifies, from the density distribution, a place where particles are generated or flow in. Note that the generation unit 33 may provide the user with the density distribution of particles in the substrate conveyance region 220 via, for example, a display apparatus such as a display. In this case, based on the density distribution of particles provided by the generation unit 33, the user may specify a place where particles are generated or flow in.

As has been described above, according to this embodiment, since the suction holes 12a and 12b are provided in the surface different from the holding surface 131, it is possible to collect particles while the hand 18 is holding the substrate 1, that is, during the conveyance of the substrate 1. Further, in this embodiment, particles are collected at each of the plurality of positions in the apparatus while allowing either one of the exhaust flow paths 15a and 15b to communicate with the exhaust source ES, that is, while switching the communication of the exhaust source ES with the exhaust flow path 15a and that with the exhaust flow path 15b. With this arrangement, it becomes possible to generate the density distribution of particles in the apparatus, and it is possible to quickly specify, from the density distribution of particles, a place where particles are generated or flow in. Note that in this embodiment, a new cleaning jig or the like is unnecessary to collect particles. Therefore, this embodiment is advantageous in particle management.

A case in which particles are collected during the conveyance of the substrate 1 has been described in this embodiment, but the present invention is not limited to this. Even in a state in which the hand 18 is not holding the substrate 1, for example, even during maintenance or idling of the lithography system 100, it is possible to collect particles in the apparatus. In other words, this embodiment can constantly collect particles in the apparatus.

Second Embodiment

FIGS. 5A to 5C are schematic views showing an example of the arrangement of a conveyance apparatus 50 that conveys an original 2 to a lithography apparatus 200 (each of processing units 210A to 210E). FIG. 5A is a plan view of the conveyance apparatus 50, FIG. 5B is a side view of the conveyance apparatus 50, and FIG. 5C is a front view of the conveyance apparatus 50. The original 2 includes a pattern corresponding to a pattern to be formed on a substrate 1. Although not shown in FIG. 1, the conveyance apparatus 50 is one of apparatuses forming a lithography system 100.

The conveyance apparatus 50 includes a hand 58 that holds the original 2 to convey the original 2, and a moving unit 59 that freely moves the hand 58. The original 2 is placed on the hand 58 almost horizontally with a pattern surface, which is a surface with the pattern formed thereon, facing downward on the Z-axis. As shown in FIG. 5B, the hand 58 includes a base member 581, and a holding portion 51 that protrudes (extends in the Z-axis direction) from the base member 581 and defines a holding surface 511 for coming into contact with the original 2 and holding the original 2. The hand 58 vacuum-chucks the original 2 on the holding surface 511 defined by the holding portion 51 in this embodiment, but the present invention is not limited to this. For example, a voltage may be applied to the holding portion 51 to generate a Coulomb force in the holding surface 511, and the original 2 may be fixed by the Coulomb force. Note that since the holding portion 51 protrudes from the base member 581 as described above, only the holding portion 51 (holding surface 511) comes into contact with the original 2. As shown in FIG. 5A, four holding portions 51 are provided in the hand 58 in this embodiment, but the present invention is not limited to this, and the number of the holding portions 51 may be two or three, or may be five or more. The moving unit 59 freely moves the hand 58 while the hand 58 is holding the original 2. Any arrangement known in the art can be applied to the moving unit 59.

As has been described above, since the original 2 is vacuum-chucked on the holding surface 511 defined by the holding portion 51 in this embodiment, the holding surface 511 is provided with a chuck hole 512, and the chuck hole 512 communicates with a vacuum source VS via a vacuum flow path 54 (second flow path). An opening/closing valve 61 is provided in the vacuum flow path 54. By opening the opening/closing valve 61 to exhaust the atmosphere (gas) in the vacuum flow path 54 to the outside by the vacuum source VS, the original 2 can be vacuum-chucked on the holding surface 511 via the chuck hole 512.

Further, in this embodiment, the hand 58 is provided with suction holes 52a and 52b. The suction holes 52a and 52b communicate with an exhaust source ES via an exhaust flow path 56. More specifically, the suction hole 52a communicates with the exhaust source ES via an exhaust flow path 55a (first flow path), and the suction hole 52b communicates with the exhaust source ES via an exhaust flow path 55b (first flow path). The exhaust flow path 55a is a flow path for exhausting the atmosphere around the suction hole 52a sucked via the exhaust source ES and the suction hole 52a to the outside. The exhaust flow path 55b is a flow path for exhausting the atmosphere around the suction hole 52b sucked via the exhaust source ES and the suction hole 52b to the outside. The exhaust flow paths 55a and 55b and the vacuum flow path 54 are independent of each other (they form systems different from each other). As shown in FIGS. 5A and 5C, two suction holes 52a and 52b are provided in the hand 58 in this embodiment, but the number of the suction holes may be one, or may be three or more.

In this embodiment, a switch valve 62 is provided in the exhaust flow path 56 (exhaust flow paths 55a and 55b). The switch valve 62 functions as a switch mechanism that selectively switches between the communication of the exhaust source ES with the exhaust flow path 55a and that with the exhaust flow path 55b. Note that the switch valve 62 also has a function of simultaneously allowing both the exhaust flow paths 55a and 55b to communicate with the exhaust source ES, and a function of blocking the communication of the exhaust source ES with both the exhaust flow paths 55a and 55b. The switch valve 62 can be replaced with a simple opening/closing valve.

Further, in this embodiment, a counting unit 71 that counts the number of particles contained in the atmosphere to be exhausted to the outside via the exhaust flow path 56 (exhaust flow paths 55a and 55b) is provided between the switch valve 62 and the exhaust source ES. The counting unit 71 may not include an exhaust source. In addition, the counting unit 71 need not be provided in the lithography apparatus 200, but may be shared by a plurality of apparatuses. In this case, the counting unit 71 may be provided in the exhaust flow path 56 as needed to count particles. The counting result of the particles obtained by the counting unit 71 is input to a generation unit 83 that has a function of generating a density distribution of particles and a function of specifying a place where particles are generated or flow in.

As shown in FIGS. 5B and 5C, the suction holes 52a and 52b are provided in a surface different from the holding surface 511. With this arrangement, it becomes possible to exhaust the atmosphere around the suction holes 52a and 52b sucked via the exhaust source ES and the suction holes 52a and 52b to the outside via the exhaust flow path 56 (exhaust flow paths 55a and 55b) while the hand 58 is holding the original 2 on the holding surface 511. Note that in this embodiment, the suction holes 52a and 52b are provided in a side surface 581c (third surface) of the base member 581 (that is, they are open along the X-axis direction) as shown in FIG. 5C. Here, the side surface 581c of the base member 581 is a surface orthogonal to a front surface 581a (first surface) of the base member 581 on the original 2 side provided with the holding portion 51 and a back surface 581b (second surface) opposite to the front surface 581a. However, the suction holes 52a and 52b may be provided in the front surface 581a of the base member 581, or may be provided in the back surface 581b of the base member 581. In other words, the suction holes 52a and 52b need only be provided in at least one of the front surface 581a, the back surface 581b, and the side surface 581c of the base member 581.

Here, the particle management in the lithography system 100 will be described. As has been described above, as an index of air cleanness, it is customary to numerically indicate how many particles (dust) each having a particle size equal to or larger than 0.5 μm are present in the air per cubic foot. Accordingly, as for an index for counting the number of particles by the counting unit 71, it is necessary to collect the atmosphere of one cubic foot per minute. When the exhaust pressure of the exhaust source ES is −101.3 kPa (vacuum) with respect to the atmospheric pressure, in order to secure the above-described flow rate while considering the pressure loss, the opening cross-sectional area of each of the suction holes 52a and 52b is preferably equal to or larger than 4.8 mm². Similarly, the opening cross-sectional area of each of the exhaust flow paths 55a and 55b is preferably equal to or larger than 4.8 mm².

Figure 6:
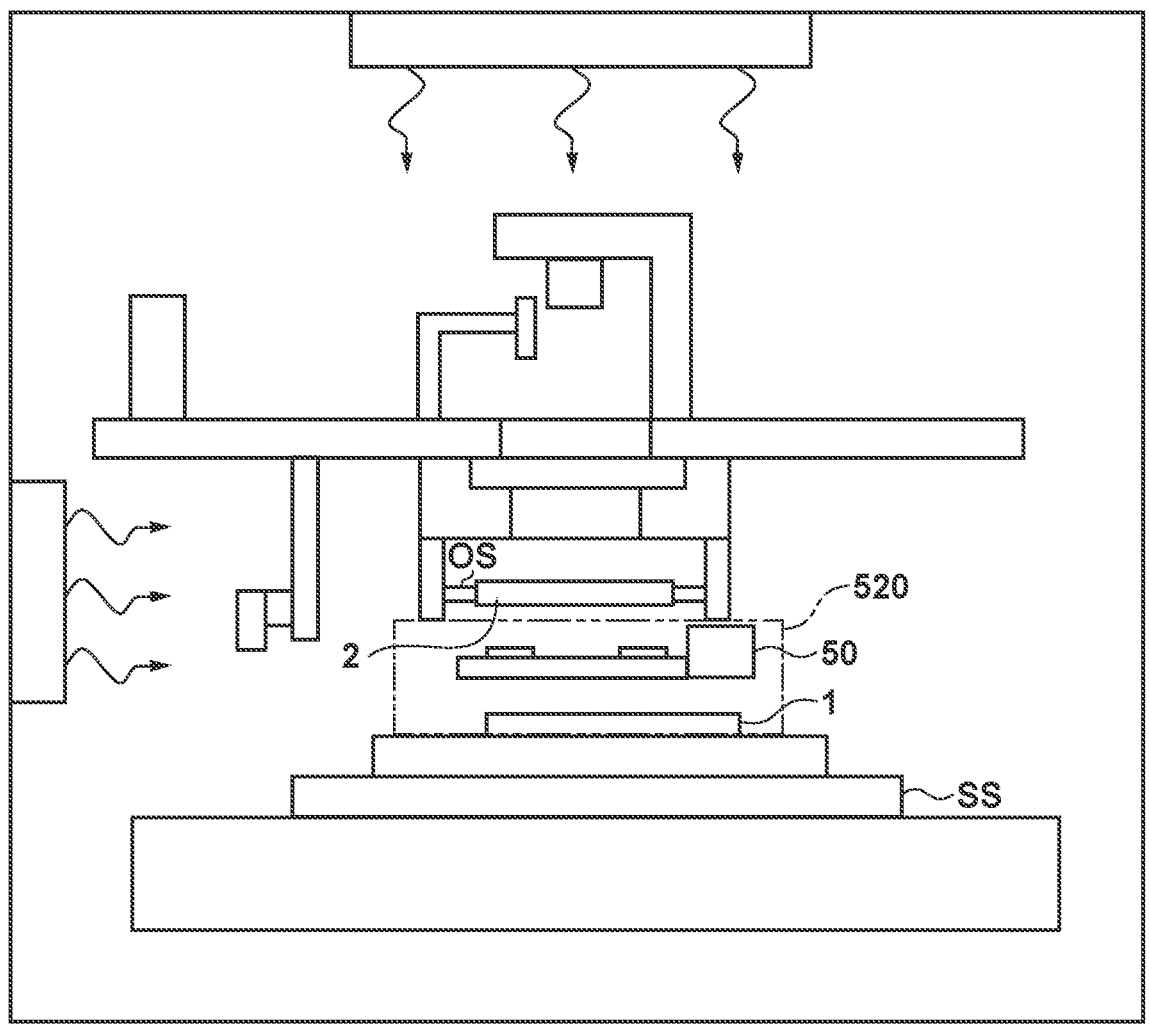
FIG. 6 is a view showing an example of a state in which the number of particles is counted.

FIG. 6 is a view showing a state in which the conveyance apparatus 50 is counting, in a processing space 520 of the processing unit 210C of the lithography apparatus 200, the number of particles contained in the atmosphere in the processing space 520. A substrate stage SS that holds the substrate 1 conveyed by a conveyance apparatus 10, and an original stage OS that holds the original 2 conveyed by the conveyance apparatus 50 are provided in the processing unit 210C. First, in a state in which the switch valve 62 allows both the exhaust flow paths 55a and 55b to communicate with the exhaust source ES, the counting unit 71 counts the number of particles in the processing space 520 of the processing unit 210C. Here, if a particle equal to or larger than a standard set in advance, for example, a particle having a particle size equal to or larger than 0.5 µm is counted (detected), the switch valve 62 sets a state in which either one of the exhaust flow paths 55a and 55b communicates with the exhaust source ES. The reason for allowing either one of the exhaust flow paths 55a and 55b to communicate with the exhaust source ES is to specify one of the suction holes 52a and 52b (the position thereof) from which particle are counted. Then, the moving unit 59 moves the hand 58 to each of a plurality of positions in the processing space 520 of the processing unit 210C. Note that the plurality of positions are set in advance so as to cover (include) the entire processing space 520 of the processing unit 210C. At this time, the counting unit 71 counts, at each of the plurality of positions in the processing space 520 of the processing unit 210C, the number of particles contained in the atmosphere around the suction hole 52a or 52b to be exhausted to the outside via the exhaust flow path 55a or 55b, respectively. The counting result of the particles at each of the plurality of positions in the processing space 520 of the processing unit 210C (the number of particles at each of the plurality of positions in the processing space 520 of the processing unit 210C counted by the counting unit 71) is input from the counting unit 71 to the generation unit 83. The generation unit 83 generates the density distribution of particles in the processing space 520 based on the counting result of the particles at each of the plurality of positions in the processing space 520 of the processing unit 210C, and specifies, from the density distribution, a place where particles are generated or flow in. Note that the generation unit 83 may provide the user with the density distribution of particles in the processing space 520 of the processing unit 210C via, for example, a display apparatus such as a display. In this case, based on the density distribution of particles provided by the generation unit 83, the user may specify a place where particles are generated or flow in. The processing as described above is not limited to the processing unit 210C, and can be performed similarly in the other processing units 210A, 210B, 210D, 210E, and 210F.

Figure 7:
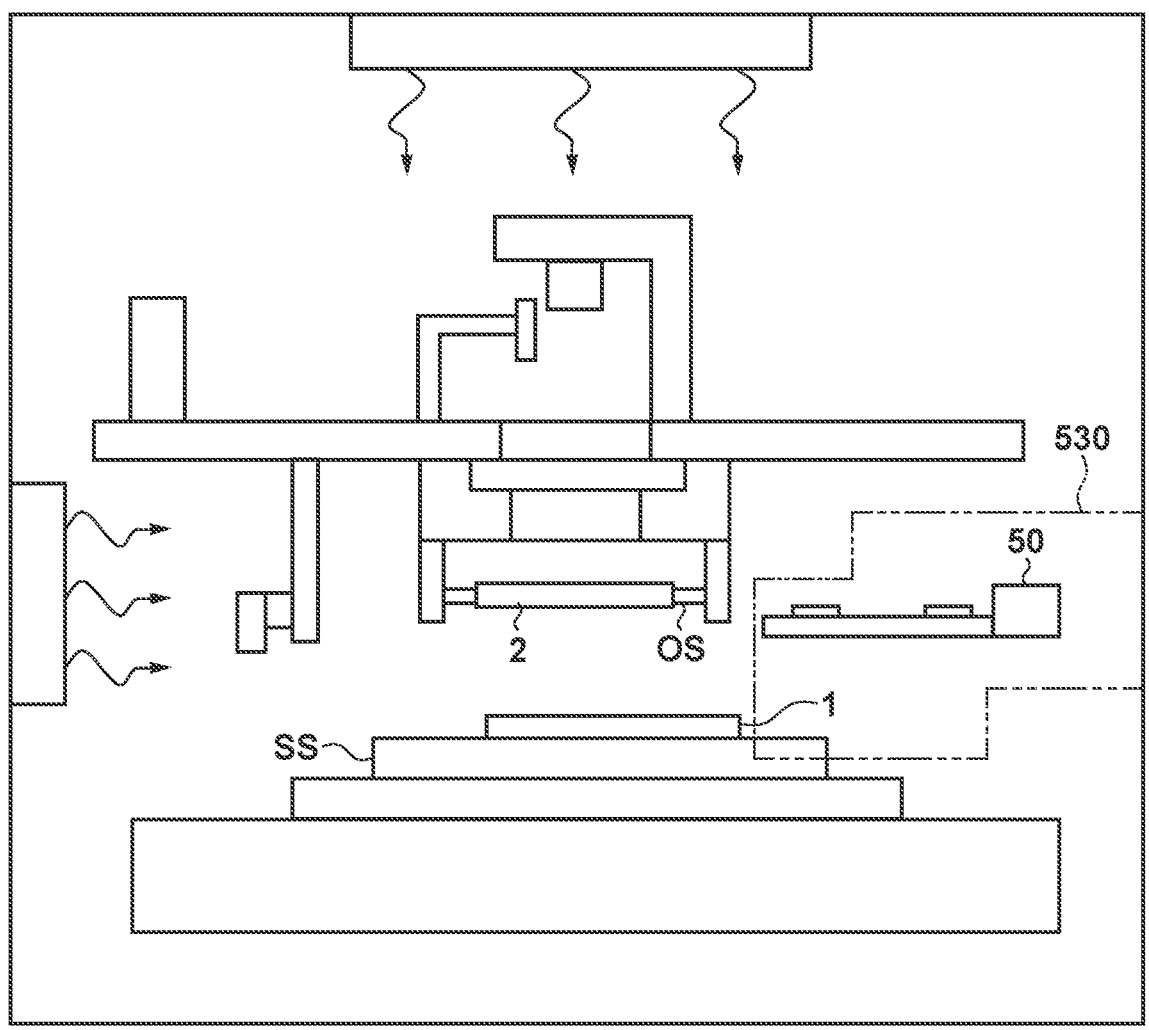
FIG. 7 is a view showing another example of the state in which the number of particles is counted.

FIG. 7 is a view showing a state in which the conveyance apparatus 50 is counting, in an original conveyance region 530 of the processing unit 210C of the lithography apparatus 200, the number of particles contained in the atmosphere in the original conveyance region 530. First, in a state in which the switch valve 62 allows both the exhaust flow paths 55a and 55b to communicate with the exhaust source ES, the counting unit 71 counts the number of particles in the entire atmosphere in the original conveyance region 530 of the processing unit 210C. Here, if a particle equal to or larger than a standard set in advance, for example, a particle having a particle size equal to or larger than 0.5 µm is counted (detected), the switch valve 62 sets a state in which either one of the exhaust flow paths 55a and 55b communicates with the exhaust source ES. Then, the moving unit 59 moves the hand 58 to each of a plurality of positions in the original conveyance region 530 of the processing unit 210C. Note that the plurality of positions are set in advance so as to cover (include) the entire original conveyance region 530. At this time, the counting unit 71 counts, at each of the plurality of positions in the original conveyance region 530, the number of particles contained in the atmosphere around the suction hole 52a or 52b to be exhausted to the outside via the exhaust flow path 55a or 55b, respectively. The counting result of the particles at each of the plurality of positions in the original conveyance region 530 of the processing unit 210C (the number of particles at each of the plurality of positions in the original conveyance region 530 counted by the counting unit 71) is input from the counting unit 71 to the generation unit 83. The generation unit 83 generates the density distribution of particles in the original conveyance region 530 based on the counting result of the particles at each of the plurality of positions in the original conveyance region 530, and specifies, from the density distribution, a place where particles are generated or flow in. Note that the generation unit 83 may provide the user with the density distribution of particles in the original conveyance region 530 via, for example, a display apparatus such as a display. In this case, based on the density distribution of particles provided by the generation unit 83, the user may specify a place where particles are generated or flow in.

As has been described above, according to this embodiment, since the suction holes 52a and 52b are provided in the surface different from the holding surface 511, it is possible to collect particles while the hand 58 is holding the original 2, that is, during the conveyance of the original 2. Further, in this embodiment, particles are collected at each of the plurality of positions in the apparatus while allowing either one of the exhaust flow paths 55a and 55b to communicate with the exhaust source ES, that is, while switching the communication of the exhaust source ES with the exhaust flow path 55a and that with the exhaust flow path 55b. With this arrangement, it becomes possible to generate the density distribution of particles in the apparatus, and it is possible to quickly specify, from the density distribution of particles, a place where particles are generated or flow in. Note that in this embodiment, a new cleaning jig or the like is unnecessary to collect particles. Therefore, this embodiment is advantageous in particle management.

A case in which particles are collected during the conveyance of the original 2 has been described in this embodiment, but the present invention is not limited to this. Even in a state in which the hand 58 is not holding the original 2, for example, even during maintenance or idling of the lithography system 100, it is possible to collect particles in the apparatus. In other words, this embodiment can constantly collect particles in the apparatus.

Third Embodiment

An article manufacturing method according to an embodiment of the present invention is suitable for manufacturing an article, for example, a device (a semiconductor device, magnetic storage medium, liquid crystal element, or the like). This manufacturing method includes a step of forming a pattern on a substrate by using the lithography system 100 or the lithography apparatus 200, a step of processing the substrate on which the pattern has been formed, and a step of manufacturing an article from the processed substrate. This manufacturing method can further includes other known steps (oxidation, deposition, vapor deposition, doping, planarization, etching, resist removal, dicing, bonding, packaging, and the like). The article manufacturing method according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-219077 filed on Dec. 3, 2019, which is hereby incorporated by reference herein in its entirety.

What is claimed is:

1. A conveyance apparatus that conveys an object to a processing space in which processing is performed using the object, comprising:
    a hand configured to hold the object; and
    a moving unit configured to freely move the hand in the processing space,
    wherein the hand includes
        a suction hole provided in a surface different from a holding surface configured to come into contact with the object and hold the object, and
        a first flow path configured to connect the suction hole and an exhaust source to exhaust an atmosphere around the suction hole sucked via the exhaust source and the suction hole to an outside while the object is held on the holding surface.

2. The apparatus according to claim 1, wherein the hand vacuum-chucks the object on the holding surface.

3. The apparatus according to claim 1, wherein
    the hand includes a chuck hole provided in the holding surface, and a second flow path configured to allow the chuck hole and a vacuum source to communicate with each other, and
    vacuum-chucks the object on the holding surface via the chuck hole by exhausting an atmosphere in the second flow path to an outside by the vacuum source, and
    the first flow path and the second flow path are independent of each other.

4. The apparatus according to claim 1, wherein
    the hand includes a base member and a holding portion configured to protrude from the base member and define the holding surface, and
    the suction hole is provided in at least one of a first surface of the base member on a side of the object, on which the holding portion is provided, a second surface opposite to the first surface, and a third surface orthogonal to the first surface and the second surface.

5. The apparatus according to claim 1, wherein
    the hand includes
        a plurality of suction holes provided in a surface different from the holding surface, and
        a plurality of first flow paths configured to allow the plurality of suction holes to communicate with the exhaust source, and exhaust the atmosphere around the suction holes sucked via the exhaust source and the plurality of suction holes to the outside, and
        the plurality of first flow paths are independent of each other.

6. The apparatus according to claim 5, further comprising a switch mechanism configured to selectively switch between the plurality of first flow paths to be communicated with the exhaust source.

7. The apparatus according to claim 1, further comprising a counting unit configured to count the number of particles contained in the atmosphere to be exhausted to the outside via the first flow path.

8. The apparatus according to claim 7, wherein
    the moving unit moves the hand to each of a plurality of positions in the processing space,
    the counting unit counts, at each of the plurality of positions, the number of particles contained in the atmosphere to be exhausted to the outside via the first flow path, and
    the conveyance apparatus further comprises a generation unit configured to generate a density distribution of the particles in the processing space based on the number of particles at each of the plurality of positions counted by the counting unit.

9. The apparatus according to claim 1, wherein the conveyance apparatus conveys the object to each of a plurality of processing spaces independent of each other, in which processing is performed using the object.

10. A lithography apparatus that forms a pattern on a substrate, comprising:
    a conveyance apparatus defined in claim 1, configured to convey the substrate as an object; and
    a stage configured to hold the substrate conveyed by the conveyance apparatus.

11. The apparatus according to claim 10, wherein the lithography apparatus comprises an imprint apparatus that forms a pattern of an imprint material on the substrate.

12. An article manufacturing method comprising:
    forming a pattern on a substrate using a lithography apparatus defined in claim 10;
    processing the substrate on which the pattern is formed in the forming; and
    manufacturing an article from the processed substrate.

13. A lithography apparatus that forms a pattern on a substrate, comprising:
    a conveyance apparatus defined in claim 1, configured to convey, as an object, an original including a pattern corresponding to the pattern to be formed on the substrate; and
    a stage configured to hold the original conveyed by the conveyance apparatus.

14. The apparatus according to claim 13, wherein the lithography apparatus comprises an imprint apparatus that forms a pattern of an imprint material on the substrate.

15. An article manufacturing method comprising:
    forming a pattern on a substrate using a lithography apparatus defined in claim 13;
    processing the substrate on which the pattern is formed in the forming; and
    manufacturing an article from the processed substrate.

* * * * *